US008363072B2

(12) United States Patent
Hong et al.

(10) Patent No.: US 8,363,072 B2
(45) Date of Patent: Jan. 29, 2013

(54) ORGANIC ELECTROLUMINESCENT DISPLAY DEVICE AND METHOD OF FABRICATING THE SAME

(75) Inventors: Soon-Kwang Hong, Daegu (KR); Jae-Ho Sim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 211 days.

(21) Appl. No.: 12/856,439

(22) Filed: Aug. 13, 2010

(65) Prior Publication Data

US 2011/0234550 A1    Sep. 29, 2011

(30) Foreign Application Priority Data

Mar. 26, 2010  (KR) .................. 10-2010-0027330

(51) Int. Cl.
*G09G 5/02*   (2006.01)
*G09G 3/30*   (2006.01)

(52) U.S. Cl. ..................... 345/694; 345/76; 345/695

(58) Field of Classification Search .......... 345/204–215, 345/690–699
See application file for complete search history.

(56) References Cited

U.S. PATENT DOCUMENTS

| 7,339,316 B2* | 3/2008 | Adachi et al. ............... 313/504 |
| 7,339,559 B2* | 3/2008 | Yokoyama ..................... 345/76 |
| 2008/0180463 A1* | 7/2008 | Ogura ............................ 345/690 |

* cited by examiner

*Primary Examiner* — Dwayne Bost
*Assistant Examiner* — Larry Sternbane
(74) *Attorney, Agent, or Firm* — Birch, Stewart, Kolasch & Birch, LLP

(57) ABSTRACT

An organic electroluminescent display device includes: first and second substrates facing and spaced apart from each other, the first and second substrates including at least one pixel region having first, second and third sub-pixel region; a gate line and a data line on the first substrate, the gate line and the data line crossing each other to define the at least one pixel region; a first electrode on the first substrate in each of the first, second and third sub-pixel regions; first, second and third organic patterns on the first electrode in the first, second and third sub-pixel regions, respectively, the first, second and third organic patterns having a zigzag shape along a first direction parallel to the gate line with respect to a virtual line passing through a central portion of each of the first, second and third sub-pixel regions; and a second electrode on the first, second and third organic patterns.

18 Claims, 8 Drawing Sheets

US 8,363,072 B2

ORGANIC ELECTROLUMINESCENT DISPLAY DEVICE AND METHOD OF FABRICATING THE SAME

This application claims the benefit of Korean Patent Application No. 10-2010-0027330, filed on Mar. 26, 2010, which is hereby incorporated by reference in its entirety.

BACKGROUND OF THE INVENTION

1. Field of the Invention

The present invention relates to an organic electroluminescent display (ELD) device, and more particularly, to an organic electroluminescent display device where aperture ratio and resolution are improved due to an arrangement of organic patterns in sub-pixel regions and a method of fabricating the organic ELD device.

2. Discussion of the Related Art

Although a cathode ray tube (CRT) was widely used as a display device, a flat panel display (FPD) such as a plasma display panel (PDP) device, a liquid crystal display (LCD) device and an organic electroluminescent display (ELD) device, which may be referred to as an organic light emitting diode (OLED) device, has been the subject of recent research and development.

Among various FPD devices, the organic ELD device of an emissive type has advantages of a light weight and a thin profile due to omission of a backlight unit. In addition, the organic ELD device has a viewing angle and a contrast ratio superior to the LCD device, and has advantages in a power consumption such that the organic ELD device is driven with a low direct current (DC) voltage. Further, the organic ELD device has a fast response speed, an excellent durability against an external impact and a wide operation temperature range. Specifically, since the fabrication process for the organic ELD device is simple, the organic ELD device has a lower production cost as compared with the LCD device. Recently, a flexible organic ELD device using a flexible substrate such as a plastic has been suggested as a FPD device for next generation. The flexible organic ELD device displays images even when the flexible ELD device is bent like a paper.

The organic ELD device emits a light using an organic electroluminescent diode. FIG. 1 is band diagram of an organic electroluminescent for an organic electroluminescent display device according to the related art. In FIG. 1, an organic electroluminescent diode 10 includes an anode 21, a hole injection layer (HIL) 37, a hole transporting layer (HTL) 33, an emission material layer (EML) 40, an electron transporting layer (ETL) 35, an electron injection layer (EIL) 39 and a cathode 25. The HIL 37 is disposed between the anode 21 and the HTL 33 and the EIL 39 is disposed between the cathode 25 and the ETL 35 for improving an emission efficiency. In addition, the EML 40 is disposed between the HTL 33 and the ETL 35.

When positive and negative voltages are applied to the anode 21 and the cathode 25, respectively, holes of the anode 21 and electrons of the cathode 25 are transported to the EML 40 to form excitons. In addition, when an excited state of the excitons is transited to a ground state, a light generated in the EML 40 is emitted as a visible light.

An organic emission layer including the HIL 37, the HTL 33, the EML 40, the ETL 35 and the EIL 39 may be fabricated through a vacuum thermal evaporation method. In the vacuum thermal evaporation method, an organic material for the organic emission layers is disposed on a evaporation source, for example, a filament, a basket and a boat, in a vacuum chamber, and a substrate is disposed over the evaporation source. After the organic material on the evaporation source is heated up, a shutter between the evaporation source and the substrate is open and the evaporated organic material is deposited on the substrate. A shadow mask having a plurality of open portions is used for a plurality of organic patterns of the organic material. After the shadow mask may be disposed adjacent to the substrate, the organic material is deposited to the substrate through the plurality of open portions of the shadow mask to form the plurality of organic patterns of the organic material.

FIG. 2 is a plan view showing a single pixel region of an organic electroluminescent display device according to the related art. In FIG. 2, an organic electroluminescent display (ELD) device includes a pixel region P and the pixel region P includes first, second and third sub-pixel regions SP1, SP2 and SP3. First, second and third organic patterns 60 are formed in the first, second and third sub-pixel regions SP1, SP2 and SP3, respectively. For example, the first, second and third organic patterns 60 may emit red, green and blue (R, G and B) colored lights, respectively. When each of the first, second and third organic patterns 60 has substantially the same area and the same size as each of the first, second and third sub-pixel regions SP1, SP2 and SP3, a border portion between the adjacent two sub-pixel regions does not emit a predetermined colored light due to overlapping, which may be referred to as a shadowing effect. To prevent the shadowing effect, the adjacent organic patterns 60 may be spaced apart by a first distance d1. For example, each of the first, second and third organic patterns 60 may have an area of about 18% of each of the first, second and third sub-pixel regions SP1, SP2 and SP3. Accordingly, the organic ELD device may have an aperture ratio of about 18%.

The portion between the adjacent organic patterns 60 may be referred to as a dead zone that is not used for emission of light. As a resolution of the organic ELD device increases, the number of pixel regions in a unit area increases. However, since the first distance d1 is not reduced in a vacuum thermal evaporation method, the size of the dead zone is not reduced without the shadowing effect and the size of the organic patterns 60 is reduced for a higher resolution. As a result, the aperture ratio and the lifetime of the organic ELD device are further reduced.

SUMMARY OF THE INVENTION

Accordingly, the present invention is directed to an organic electroluminescent display device and a method of fabricating the same that substantially obviate one or more of the problems due to limitations and disadvantages of the related art.

An advantage of the present invention is to provide an organic electroluminescent display device where a resolution and an aperture ratio are improved due to an arrangement of organic patterns in sub-pixel regions.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display device includes: first and second substrates facing and spaced apart from each other, the first and second substrates including at least one pixel region having first, second and third sub-pixel region; a gate line and a data line on the first substrate, the gate line and the data line crossing each other to define the at least one pixel region; a first electrode on the first substrate in each of the first, second and third sub-pixel regions; first, second and third organic patterns on the first electrode in the first, second and third sub-pixel regions, respectively, the first, second and third organic patterns having a zigzag shape along a first direction parallel to the gate line with respect to a virtual line passing through a central portion of each of the first, second and third sub-pixel regions; and a second electrode on the first, second and third organic patterns.

In another aspect, a method of fabricating an organic electroluminescent display device includes: forming a gate line and a data line on a first substrate, the gate line and the data line crossing each other to define at least one pixel region having first, second and third sub-pixel region; forming a first electrode on the first substrate in each of the first, second and third sub-pixel regions; forming first, second and third organic patterns on the first electrode in the first, second and third sub-pixel regions, respectively, using a shadow mask, the first, second and third organic patterns having a zigzag shape along a first direction parallel to the gate line with respect to a virtual line passing through a central portion of each of the first, second and third sub-pixel regions; forming a second electrode on the first, second and third organic patterns; and attaching a second substrate to the first substrate with a seal pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used to refer to the same or similar parts.

Figure 3:
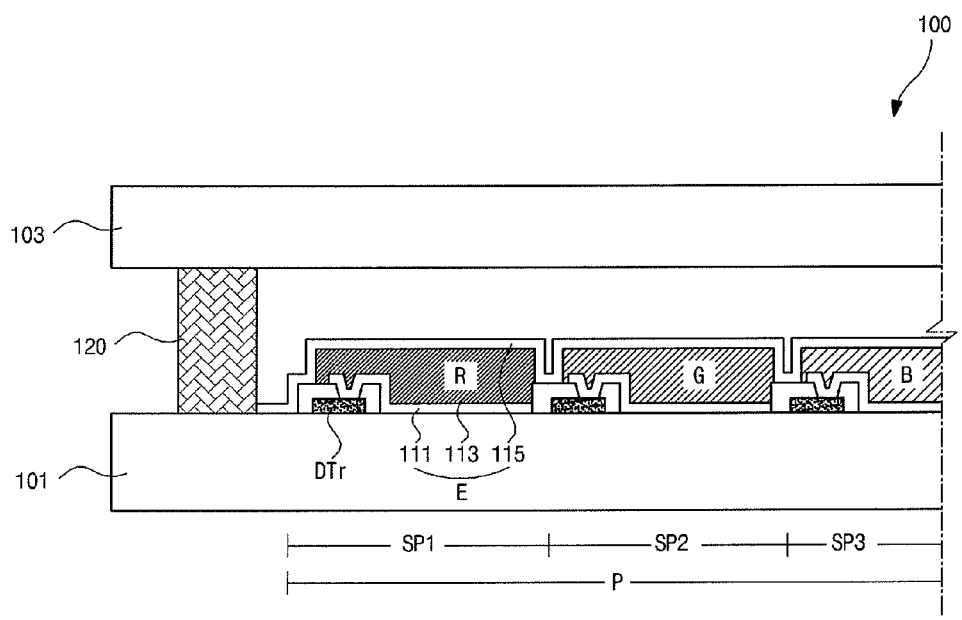
FIG. 3 is a cross-sectional view showing an organic electroluminescent display device according to a first embodiment of the present invention.

FIG. 3 is a cross-sectional view showing an organic electroluminescent display device according to a first embodiment of the present invention.

In FIG. 3, an organic electroluminescent display (ELD) device 100 of a bottom emission type includes first and second substrates 101 and 103 spaced apart from each other. The first and second substrates 101 and 103 are attached to each other and sealed with a seal pattern 120 at a boundary portion. In addition, the first and second substrates 101 and 103 includes a plurality of pixel regions P and each pixel region P includes first, second and third sub-pixel regions SP1, SP2 and SP3. For example, the first, second and third sub-pixel regions SP1, SP2 and SP3 may correspond to red (R), green (G) and blue (B) sub-pixel regions. A switching thin film transistor (TFT) (not shown), a driving TFT DTr and a storage capacitor (not shown) are formed on the first substrate in each of the first, second and third sub-pixel region SP1, SP2 and SP3. In addition, a first electrode 111 connected to the driving TFT DTr is formed on the first substrate 101 in each of the first, second and third sub-pixel regions SP1, SP2 and SP3, and an organic emission layer and a second electrode 115 are sequentially formed on the first electrode 111. The first electrode 111, the organic emission layer 113 and the second electrode 115 constitute an organic electroluminescent (EL) diode E.

Although not shown in FIG. 3, the driving TFT DTr includes a gate electrode, a semiconductor layer, a source electrode and a drain electrode. The driving TFT DTr may have a top gate type including a polycrystalline silicon layer as the semiconductor layer, or may have a bottom gate type including an intrinsic amorphous silicon layer and an impurity-doped amorphous silicon layer as the semiconductor layer. When the driving TFT DTr has a top gate type, the semiconductor layer of polycrystalline silicon may include an active region for a channel and source and drain regions at both sides of the active region. The source and drain regions are doped with impurities of high concentration. A gate insulating layer is formed on the semiconductor layer, and a gate electrode is formed on the gate insulating layer over the gate electrode. In addition, source and drain electrodes contacting the source and drain regions, respectively, are formed on the gate insulating layer. The organic EL diode E is formed over the driving TFT DTr and the first electrode 111 of the organic EL diode E is connected to the drain electrode of the driving TFT DTr.

The first and second electrodes 111 and 115 of the organic EL diode E may function as an anode and a cathode, respectively, such that a work function of the first electrode 111 is greater than a work function of the second electrode 115. For example, the first electrode 111 may include a transparent conductive material such as indium-tin-oxide (ITO) and indium-zinc-oxide (IZO), and the second electrode 115 may include a metallic material such as aluminum (Al), aluminum (Al) alloy (e.g., aluminum neodymium (AlNd)), silver (Ag), magnesium (Mg), gold (Au) and aluminum magnesium (AlMg). Accordingly, the organic ELD device 100 has a bottom emission type where a light is emitted from the organic emission layer 113 to the first electrode 111.

The organic emission layer 113 includes first, second and third organic patterns in the first, second and third sub-pixel regions SP1, SP2 and SP3, respectively. For example, the first, second and third organic patterns may include red, green and blue organic patterns, respectively. The first, second and third organic patterns may be formed by depositing an organic material through a vacuum thermal evaporation method. Since each of the first, second and third organic patterns is formed in one of a upper half portion and a lower half portion of each of the first, second and third sub-pixel regions SP1, SP2 and SP3 and the first, second and third organic patterns are alternately disposed along a horizontal direction, a resolution and an aperture ratio are improved without a shadowing effect.

The organic emission layer 113 may be formed of a single layer of an emitting material or a multiple layer of a hole injection layer (HIL), a hole transporting layer (HTL), an emitting material layer (EML), an electron transporting layer (ETL) and an electron injection layer (EIL).

When a voltage corresponding to a selected color signal is applied to the first and second electrodes 111 and 115 of the organic ELD device 100, holes from the first electrode 111 and electrons from the second electrode 115 are transported to the organic emission layer 113 to generate excitons, and a light is emitted as a visible ray due to transition of the excitons from an excited state to a ground state. In addition, the light is emitted through the transparent first electrode 111 to display images.

Figure 4:
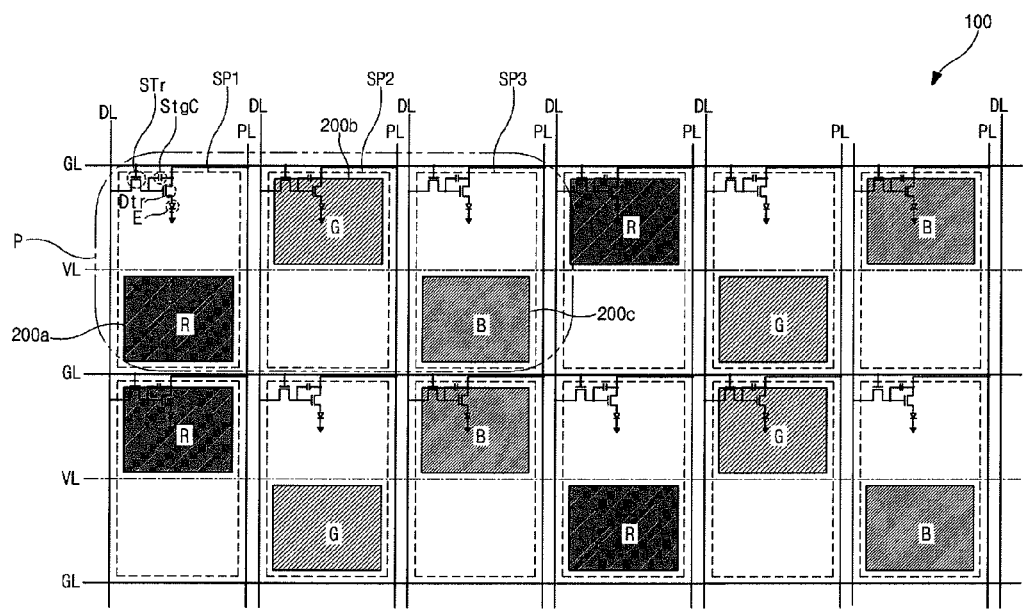
FIG. 4 is a plan view showing an organic electroluminescent display device according to a first embodiment of the present invention.

FIG. 4 is a plan view showing an organic electroluminescent display device according to a first embodiment of the present invention.

In FIG. 4, an organic electroluminescent display device 100 includes a plurality of pixel regions P, and each pixel region P includes first, second and third sub-pixel regions SP1, SP2 and SP3. A first electrode of an organic electroluminescent (EL) diode E is formed in each of the first, second and third sub-pixel regions SP1, SP2 and SP3, and first, second and third organic patterns 200a, 200b and 200c for an organic emission layer 113 (of FIG. 3) are formed on the first electrode in the first, second and third sub-pixel regions SP1, SP2 and SP3, respectively. For example, the first, second and third organic patterns 200a, 200b and 200c may correspond to red (R), green (G) and blue (B) organic patterns, respectively. In addition, the first, second and third organic patterns 200a, 200b and 200c may have a stripe type such that the red, green and blue organic patterns are alternately disposed along a horizontal direction (a first direction) parallel to the gate line GL and each of the red, green and blue organic patterns having the same color is straightly disposed along a vertical direction (a second direction) parallel to the data line DL. A second electrode may be formed on an entire surface of the first, second and third organic patterns 200a, 200b and 200c. Further, a switching thin film transistor (TFT) STr, a driving TFT DTr and a storage capacitor StgC are formed in each of the first, second and third sub-pixel regions SP1, SP2 and SP3.

A gate line GL is formed along the first direction and a data line DL is formed along the second direction. The gate line GL crosses the data line DL to define each of the first, second and third sub-pixel regions SP1, SP2 and SP3. A power line PL is formed along the second direction to be spaced apart and parallel to the data line DL. The switching TFT STr is connected to the gate line GL and the data line DL, and the driving TFT DTr and the storage capacitor StgC are connected to the switching TFT STr. The driving TFT DTr is connected between the power line PL and the organic EL diode E. For example, the first electrode of the organic EL diode E may be connected to a drain electrode of the driving TFT DTr and the second electrode of the organic EL diode E may be grounded. A source voltage of the power line is supplied to the organic EL diode E through the driving TFT DTr.

When a gate signal of the gate line GL is applied to the switching TFT STr in each of the first, second and third sub-pixel regions SP1, SP2 and SP3, the switching TFT STr is turned on and a data signal of the data line DL is applied to the driving TFT DTr through the switching TFT STr. As a result, the driving TFT DTr is turned on and the source voltage of the power line PL is applied to the organic EL diode E to emit a light of one of red, green and blue colors. Since a current of the driving TFT DTr is determined by the data signal applied to a gate electrode of the driving TFT DTr, the organic EL diode E displays a gray scale corresponding to the data signal. When the switching TFT STr is turned off, the storage capacitor StgC keeps a gate voltage of the driving TFT DTr constant. Accordingly, the current level passing through the organic EL diode E is kept constant till the next frame even when the switching TFT STr is turned off.

The first, second and third organic patterns 200a, 200b and 200c are disposed in the first, second and third sub-pixel regions SP1, SP2 and SP3 to have a zigzag shape along the first direction with respect to a virtual line VL. The virtual line VL parallel to the gate line GL may be defined a line passing through a central portion of each of the first, second and third sub-pixel regions SP1, SP2 and SP3. Accordingly, the virtual line VL divides each of the first, second and third sub-pixel regions SP1, SP2 and SP3 into an upper half portion and a lower half portion. For example, the first organic pattern 200a may be disposed in the lower half portion of the first sub-pixel region SP1, the second organic pattern 200b may be disposed in the upper half portion of the second sub-pixel region SP2, and the third organic pattern 200c may be disposed in the lower half portion of the third sub-pixel region SP3. Accordingly, the organic patterns are disposed in one of the upper half portion and the lower half portion of each sub-pixel region such that the organic patterns of the two adjacent sub-pixel regions along the first direction are spaced apart from each other along a diagonal direction with respect to the first and second directions.

Since the first, second and third organic patterns 200a, 200b and 200c are enlarged and spaced apart from each other by a first distance for preventing a shadowing effect, an aperture ratio of the organic ELD device 100 increases without the shadowing effect. In addition, since the number of pixel regions in a unit area increases by minimizing an area for the first, second and third organic patterns 200a, 200b and 200c, a resolution of the organic ELD device increases without the shadowing effect.

The first electrode of the organic EL diode E is disposed in one of the upper half portion and the lower half portion of each of the first, second and third sub-pixel regions SP1, SP2 and SP3 to correspond to each of the first, second and third organic patterns 200a, 200b and 200c. For example, when the first organic pattern 200a is disposed in the lower half portion of the first sub-pixel region SP1, the first electrode of the organic EL diode E may be disposed in the lower half portion of the first sub-pixel region SP1 and may be connected to the drain electrode of the driving TFT DTr through an extending portion.

Figure 5:
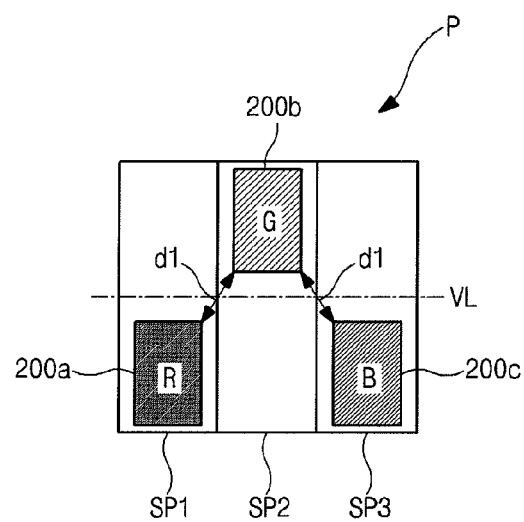
FIG. 5 is a plan view showing a single pixel region of an organic electroluminescent display device according to a first embodiment of the present invention.

FIG. 5 is a plan view showing a single pixel region of an organic electroluminescent display device according to a first embodiment of the present invention.

In FIG. 5, a single pixel region P includes first, second and third sub-pixel regions SP1, SP2 and SP3, and each of first, second and third organic patterns 200a, 200b and 200c is disposed in one of an upper half portion and a lower half portion of each of the first, second and third sub-pixel regions SP1, SP2 and SP3. The upper half portion and the lower half portion may be defined by a virtual line VL passing through a central portion of each of the first, second and third sub-pixel regions SP1, SP2 and SP3. For example, the virtual line VL may be parallel to a first direction, and the upper half portion and the lower half portion may be disposed along a second direction perpendicular to the first direction. In addition, the first, second and third organic patterns 200a, 200b and 200c may emit red, green and blue colored lights, respectively. Each of the first, second and third organic patterns 200a, 200b and 200c may have a rectangular shape.

Figure 1:
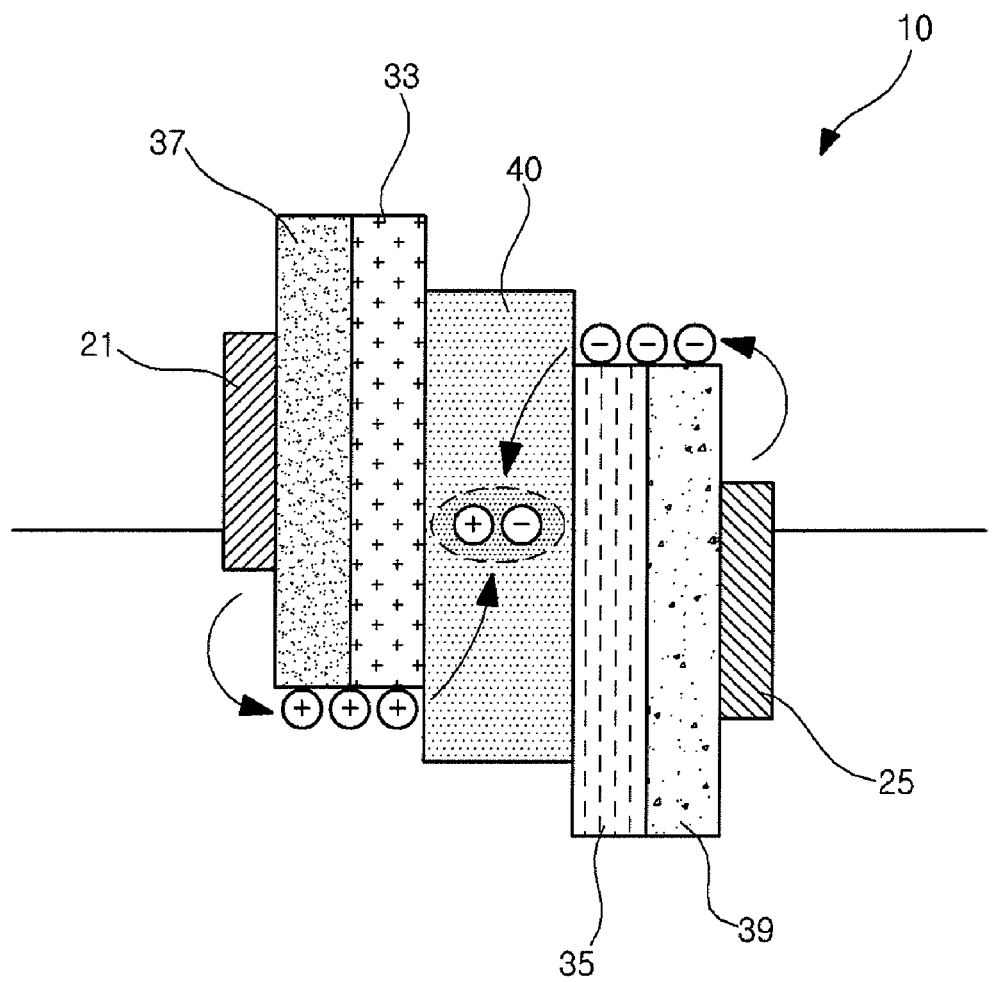
FIG. 1 is band diagram of an organic electroluminescent for an organic electroluminescent display device according to the related art.
Figure 2:
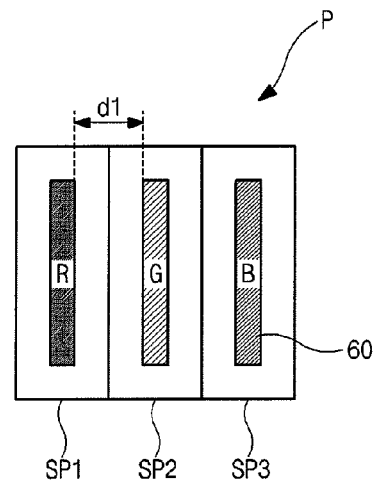
FIG. 2 is a plan view showing a single pixel region of an organic electroluminescent display device according to the related art.

The first organic pattern 200a is disposed in the lower portion of the first sub-pixel region SP1, the second organic pattern 200b is disposed in the upper portion of the second sub-pixel region SP2, and the third organic pattern 200c is disposed in the lower portion of the third sub-pixel region SP3. Accordingly, the first, second and third organic patterns 200a, 200b and 200c are disposed to have a zigzag shape along the first direction with respect to the virtual line VL. In addition, the first and second organic patterns 200a and 200b are spaced apart from each other by a first distance d1 for preventing a shadowing effect along a diagonal direction with respect to the first and second directions, and the second and third organic patterns 200b and 200c are spaced apart from each other by the first distance d1 along the diagonal direction. Since the two adjacent organic patterns are spaced apart from each other along the diagonal direction, each of the first, second and third organic patterns 200a, 200b and 200c may have an area similar to one of the upper half portion and the lower half portion. Accordingly, each of the first, second and third organic patterns 200a, 200b and 200c has an enlarged area as compared with the organic pattern 60 (of FIG. 2) of the related art. As a result, an aperture ratio is improved with obtaining the first distance d1. For example, each of the first, second and third organic patterns 200a, 200b and 200c may have an area of about 30% of each of the first, second and third sub-pixel regions SP1, SP2 and SP3 and the organic ELD device may have an aperture ratio of about 30%.

Further, since the aperture ratio is improved, the organic ELD device according to the present invention may have an aperture ratio equal to or greater than the organic ELD device according to the related art even when the area of the pixel region is reduced. Accordingly, the number of pixel regions in a unit area may increase by reducing the area of the pixel region, and a resolution of the organic ELD device is improved.

Figure 6:
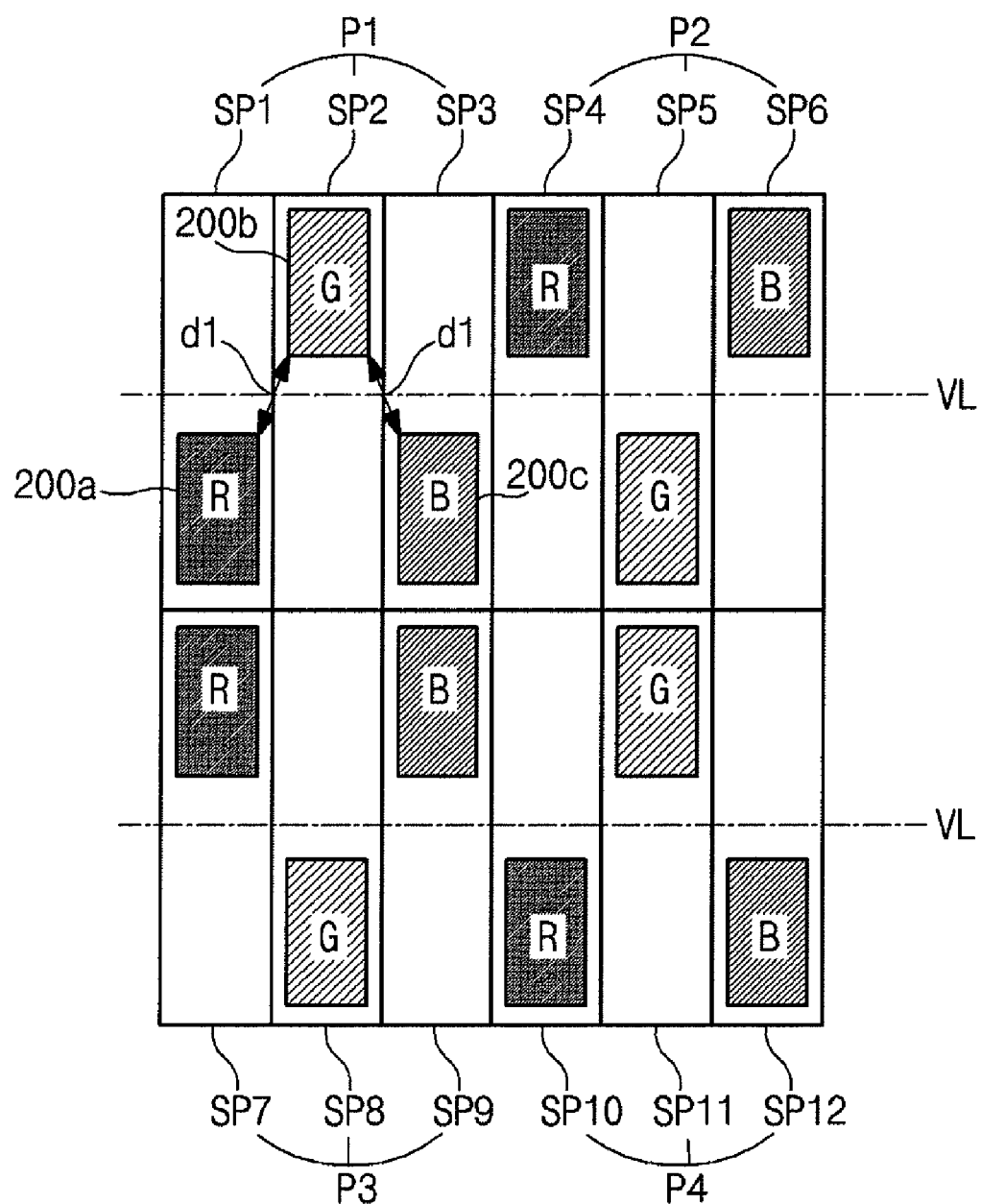
FIG. 6 is a plan view showing 4 pixel regions of an organic electroluminescent display device according to a first embodiment of the present invention.

FIG. 6 is a plan view showing 4 pixel regions of an organic electroluminescent display device according to a first embodiment of the present invention.

In FIG. 6, first to fourth pixel regions P1 to P4 are disposed in 2×2 matrix such that the first and second pixel regions P1 and P2 are disposed along a first direction in a first row and the third and fourth pixel regions P3 and P4 are disposed along the first direction in a second row. The first pixel region P1 includes first, second and third sub-pixel regions SP1, SP2 and SP3, and the second pixel region P2 includes fourth, fifth and sixth sub-pixel regions SP4, SP5 and SP6. The third pixel region P3 includes seventh, eighth and ninth sub-pixel regions SP7, SP8 and SP9, and the fourth pixel region P4 includes tenth, eleventh and twelfth sub-pixel regions SP10, SP11 and SP12. Each of the first to fourth pixel regions P1 to P4 includes first, second and third organic patterns 200a, 200b and 200c, and the first, second and third organic patterns 200a, 200b and 200c may emit red, green and blue colored lights, respectively. Each of the first to twelfth sub-pixel regions SP1 to SP12 is divided into an upper half portion and a lower half portion by a virtual line VL parallel to the first direction.

The first, second and third organic patterns 200a, 200b and 200c may have a stripe type such that the red, green and blue organic patterns are alternately disposed along the first direction and the organic patterns having the same color are disposed along a second direction perpendicular to the first direction. The first, second and third organic patterns 200a, 200b and 200c of the first and second pixel regions P1 and P2 have a zigzag shape along the first direction with respect to the virtual line VL, and the first, second and third organic patterns 200a, 200b and 200c of the third and fourth pixel regions P3 and P4 have a zigzag shape along the first direction with respect to the virtual line VL. In addition, the organic patterns of the two adjacent pixel regions along the first direction are spaced apart from each other by a first distance d1 for preventing a shadowing effect along a diagonal direction with respect to the first and second directions.

The first organic pattern 200a is disposed in the lower portion of the first sub-pixel region SP1, the second organic pattern 200b is disposed in the upper portion of the second sub-pixel region SP2, and the third organic pattern 200c is disposed in the lower portion of the third sub-pixel region SP3. In addition, the first organic pattern 200a is disposed in the upper half portion of the fourth sub-pixel region SP4, the second organic pattern 200b is disposed in the lower portion of the fifth sub-pixel region SP5, and the third organic pattern 200c is disposed in the upper portion of the sixth sub-pixel region SP6. Similarly, the first organic pattern 200a is disposed in the upper portion of the seventh sub-pixel region SP7, the second organic pattern 200b is disposed in the lower portion of the eighth sub-pixel region SP8, and the third organic pattern 200c is disposed in the upper portion of the ninth sub-pixel region SP9. In addition, the first organic pattern 200a is disposed in the lower half portion of the tenth sub-pixel region SP10, the second organic pattern 200b is disposed in the upper portion of the eleventh sub-pixel region SP11, and the third organic pattern 200c is disposed in the lower portion of the twelfth sub-pixel region SP12.

Accordingly, the first, second and third organic patterns 200a, 200b and 200c of the first and second pixel regions P1 and P2 and the third and fourth pixel regions P3 and P4 are disposed to have a zigzag shape along the first direction with respect to the virtual line VL. In addition, the two organic patterns corresponding to the same color of the two adjacent sub-pixel regions along the second direction are disposed to be adjacent to each other. For example, the first organic patterns 200a of the first and seventh sub-pixel regions SP1 and SP7 may be disposed to be adjacent to each other in a border portion between the first and second rows. Further, the third organic patterns 200c of the third and ninth sub-pixel regions SP3 and SP9 may be disposed to be adjacent to each other in the border portion between the first and second rows, and the second organic patterns 200b of the fifth and eleventh sub-pixel regions SP5 and SP11 may be disposed to be adjacent to each other in the border portion between the first and second rows.

The organic ELD device may be formed by repeating the 4 pixel regions of FIG. 6 along the first and second directions, and the two organic patterns corresponding to the same color of the two adjacent sub-pixel regions along the second direction are disposed to be adjacent to each other throughout the whole organic ELD device. Accordingly, the two organic patterns corresponding to the same color may be formed by using a single open portion of a shadow mask in a vacuum thermal evaporation method. As a result, a limitation in fabrication resolution of the shadow mask is removed, and fabrication yield is improved.

Figure 7:
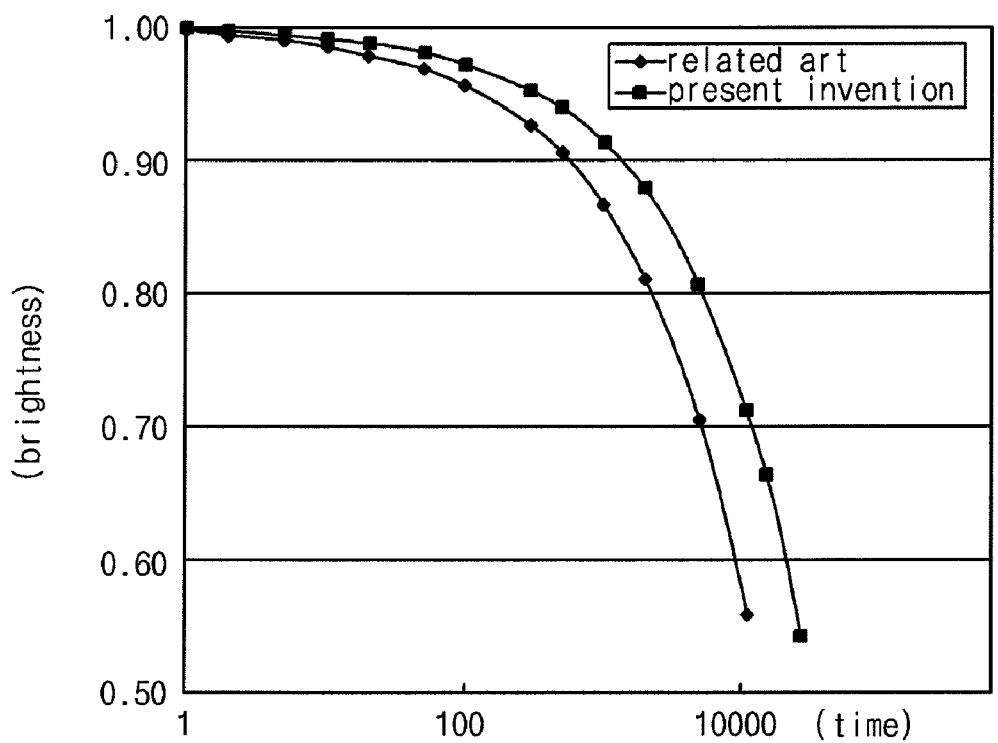
FIG. 7 is a graph showing a brightness change according to an operation time of an organic electroluminescent display device according to a first embodiment of the present invention.

FIG. 7 is a graph showing a brightness change according to an operation time of an organic electroluminescent display device according to a first embodiment of the present invention. For comparison, a curve of the organic electroluminescent display device according to the related art is added to FIG. 7.

In FIG. 7, a lifetime of the organic ELD device according to the first embodiment of the present invention is improved as compared with the organic ELD device according to the related art. As an area of the organic emission layer 113 (of FIG. 3) is reduced, a current density increases in the organic emission layer 113. As a result, the organic emission layer 113 of the organic EL diode E (of FIG. 3) is deteriorated more rapidly and the lifetime of the organic ELD device 100 (of FIG. 3) is reduced. In the organic ELD device 100 of the present invention, since the area of the organic emission layer 113 is enlarged, the deterioration of the organic EL diode E is mitigated and the lifetime is elongated.

Figure 8:
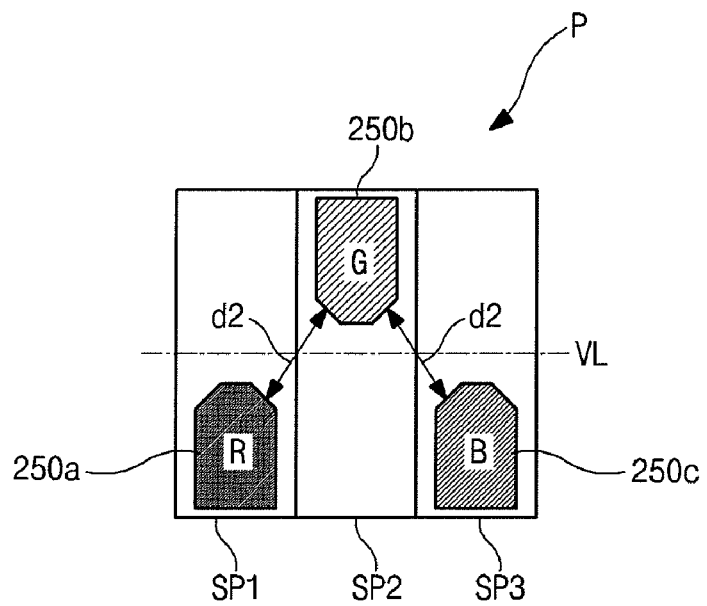
FIG. 8 is a plan view showing a single pixel region of an organic electroluminescent display device according to a second embodiment of the present invention.

FIG. 8 is a plan view showing a single pixel region of an organic electroluminescent display device according to a second embodiment of the present invention.

In FIG. 8, a single pixel region P includes first, second and third sub-pixel regions SP1, SP2 and SP3, and each of first, second and third organic patterns 250a, 250b and 250c is disposed in one of an upper half portion and a lower half portion of each of the first, second and third sub-pixel regions SP1, SP2 and SP3. The upper half portion and the lower half portion may be defined by a virtual line VL passing through a central portion of each of the first, second and third sub-pixel regions SP1, SP2 and SP3. For example, the virtual line VL may be parallel to a first direction, and the upper half portion and the lower half portion may be disposed along a second direction perpendicular to the first direction. In addition, the first, second and third organic patterns 250a, 250b and 250c may emit red, green and blue colored lights, respectively. Each of the first, second and third organic patterns 250a, 250b and 250c may have a rectangular shape having two truncated corners.

The first organic pattern 250a is disposed in the lower portion of the first sub-pixel region SP1, the second organic pattern 250b is disposed in the upper portion of the second sub-pixel region SP2, and the third organic pattern 250c is disposed in the lower portion of the third sub-pixel region SP3. Accordingly, the first, second and third organic patterns 250a, 250b and 250c are disposed to have a zigzag shape along the first direction with respect to the virtual line VL. In addition, the first and second organic patterns 250a and 250b are spaced apart from each other by a second distance d2 for preventing a shadowing effect along a diagonal direction with respect to the first and second directions, and the second and third organic patterns 250b and 250c are spaced apart from each other by the second distance d2 along the diagonal direction. Since the two adjacent organic patterns are spaced apart from each other along the diagonal direction, each of the first, second and third organic patterns 250a, 250b and 250c may have an area similar to one of the upper half portion and the lower half portion.

Since each of the first, second and third organic patterns 250a, 250b and 250c has a rectangular shape having two truncated corners, the second distance d2 between two of the first, second and third organic patterns 250a, 250b and 250c may be greater than the first distance d1 (of FIG. 5) between two of the first, second and third organic patterns 200a, 200b and 200c (of FIG. 5) each having a rectangular shape. Alternatively, each of the first, second and third organic patterns 250a, 250b and 250c may be formed to have an area greater than an area of each of the first, second and third organic patterns 200a, 200b and 200c by designing the second distance d2 equal to the first distance d1. Accordingly, each of the first, second and third organic patterns 250a, 250b and 250c may have a further enlarged area as compared with the organic pattern 60 (of FIG. 2) of the related art. As a result, an aperture ratio is further improved with obtaining the first distance d1.

Further, since the aperture ratio is improved, the organic ELD device according to the present invention may have an aperture ratio equal to or greater than the organic ELD device according to the related art even when the area of the pixel region is reduced. Accordingly, the number of pixel regions in a unit area may increase by reducing the area of the pixel region, and a resolution of the organic ELD device is improved.

Figure 9:
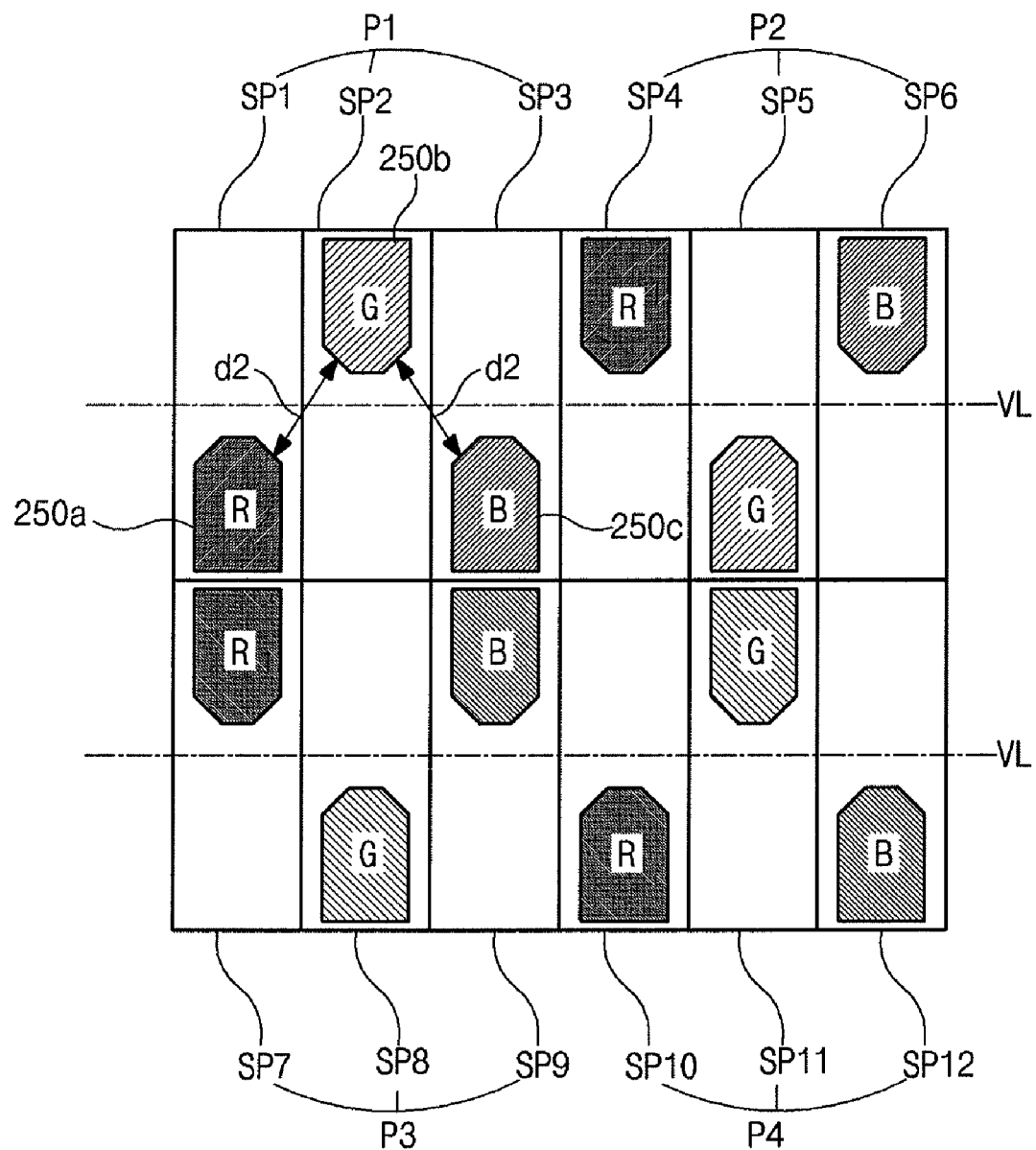
FIG. 9 is a plan view showing 4 pixel regions of an organic electroluminescent display device according to a second embodiment of the present invention.

FIG. 9 is a plan view showing 4 pixel regions of an organic electroluminescent display device according to a second embodiment of the present invention.

In FIG. 9, first and second pixel regions P1 and P2 are disposed along a first direction in a first row and third and fourth pixel regions P3 and P4 are disposed along the first direction in a second row. The first pixel region P1 includes first, second and third sub-pixel regions SP1, SP2 and SP3, and the second pixel region P2 includes fourth, fifth and sixth sub-pixel regions SP4, SP5 and SP6. The third pixel region P3 includes seventh, eighth and ninth sub-pixel regions SP7, SP8 and SP9, and the fourth pixel region P4 includes tenth, eleventh and twelfth sub-pixel regions SP10, SP11 and SP12. Each of the first to fourth pixel regions P1 to P4 includes first, second and third organic patterns 250a, 250b and 250c, and the first, second and third organic patterns 250a, 250b and 250c may emit red, green and blue colored lights, respectively. Each of the first to twelfth sub-pixel regions SP1 to SP12 is divided into an upper half portion and a lower half portion by a virtual line VL parallel to the first direction.

The first, second and third organic patterns 250a, 250b and 250c may have a stripe type such that the red, green and blue organic patterns are alternately disposed along the first direction and the organic patterns having the same color are disposed along a second direction perpendicular to the first direction. In addition, the organic patterns of the two adjacent pixel regions along the first direction are spaced apart from each other by a first distance d1 for preventing a shadowing effect along a diagonal direction with respect to the first and second directions.

The first organic pattern 250a is disposed in the lower portion of the first sub-pixel region SP1, the second organic pattern 250b is disposed in the upper portion of the second sub-pixel region SP2, and the third organic pattern 250c is disposed in the lower portion of the third sub-pixel region SP3. In addition, the first organic pattern 250a is disposed in the upper half portion of the fourth sub-pixel region SP4, the second organic pattern 250b is disposed in the lower portion of the fifth sub-pixel region SP5, and the third organic pattern 250c is disposed in the upper portion of the sixth sub-pixel region SP6. Similarly, the first organic pattern 250a is disposed in the upper portion of the seventh sub-pixel region SP7, the second organic pattern 250b is disposed in the lower portion of the eighth sub-pixel region SP8, and the third organic pattern 250c is disposed in the upper portion of the ninth sub-pixel region SP9. In addition, the first organic pattern 250a is disposed in the lower half portion of the tenth sub-pixel region SP10, the second organic pattern 250b is disposed in the upper portion of the eleventh sub-pixel region SP11, and the third organic pattern 250c is disposed in the lower portion of the twelfth sub-pixel region SP12.

Accordingly, the first, second and third organic patterns 250a, 250b and 250c are disposed to have a zigzag shape along the first direction with respect to the virtual line VL. In addition, the two organic patterns corresponding to the same color of the two adjacent sub-pixel regions along the second direction are disposed to be adjacent to each other. For example, the first organic patterns 250a of the first and seventh sub-pixel regions SP1 and SP7 may be disposed to be adjacent to each other in a border portion between the first and second rows. Further, the third organic patterns 250c of the third and ninth sub-pixel regions SP3 and SP9 may be disposed to be adjacent to each other in the border portion between the first and second rows, and the second organic patterns 250b of the fifth and eleventh sub-pixel regions SP5 and SP11 may be disposed to be adjacent to each other in the border portion between the first and second rows.

The organic ELD device may be formed by repeating the 4 pixel regions of FIG. 6 along the first and second directions, and the two organic patterns corresponding to the same color of the two adjacent sub-pixel regions along the second direction are disposed to be adjacent to each other throughout the whole organic ELD device. Accordingly, the two organic patterns corresponding to the same color may be formed by using a single open portion of a shadow mask in a vacuum thermal evaporation method. As a result, a limitation in resolution of the shadow mask is removed, and fabrication yield is improved.

Figure 10A:
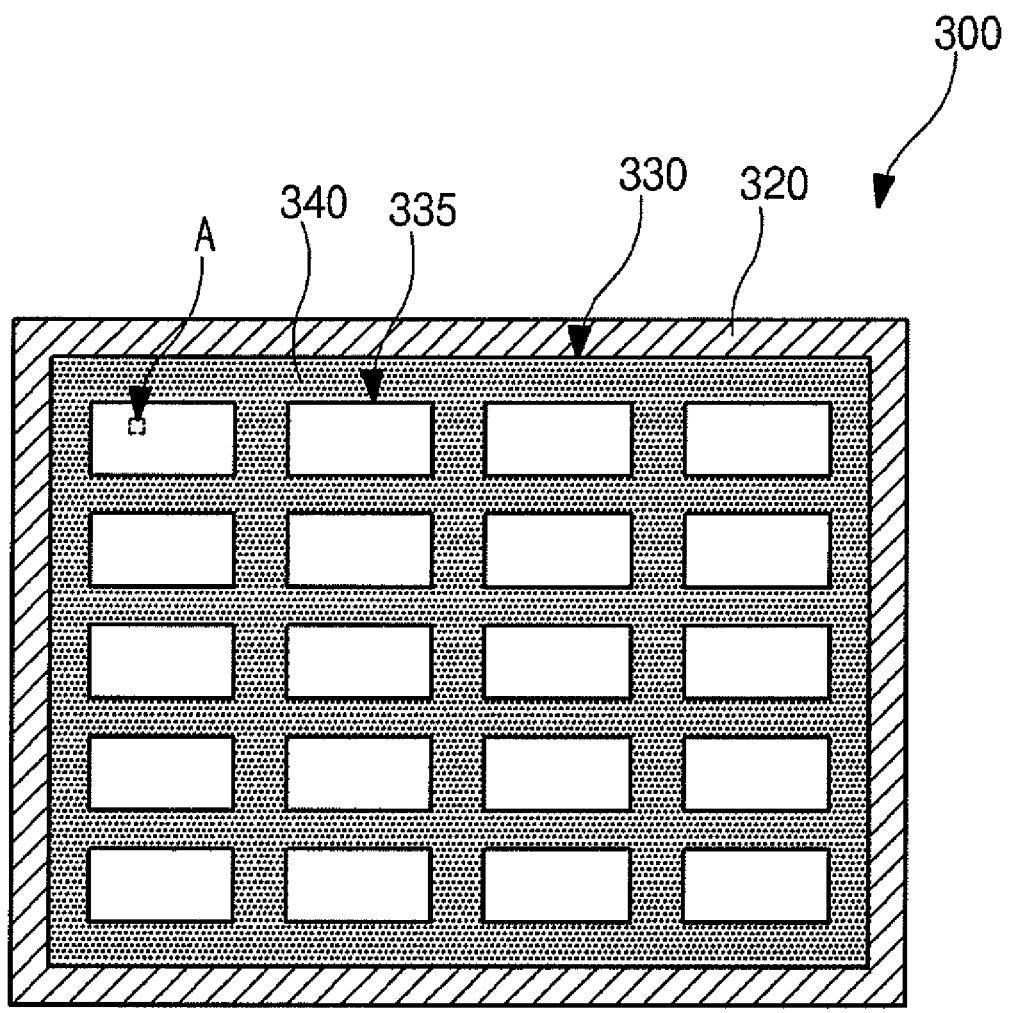
FIG. 10A is a plan view showing a shadow mask for fabricating an organic electroluminescent display device according to a second embodiment of the present invention.
Figure 10B:
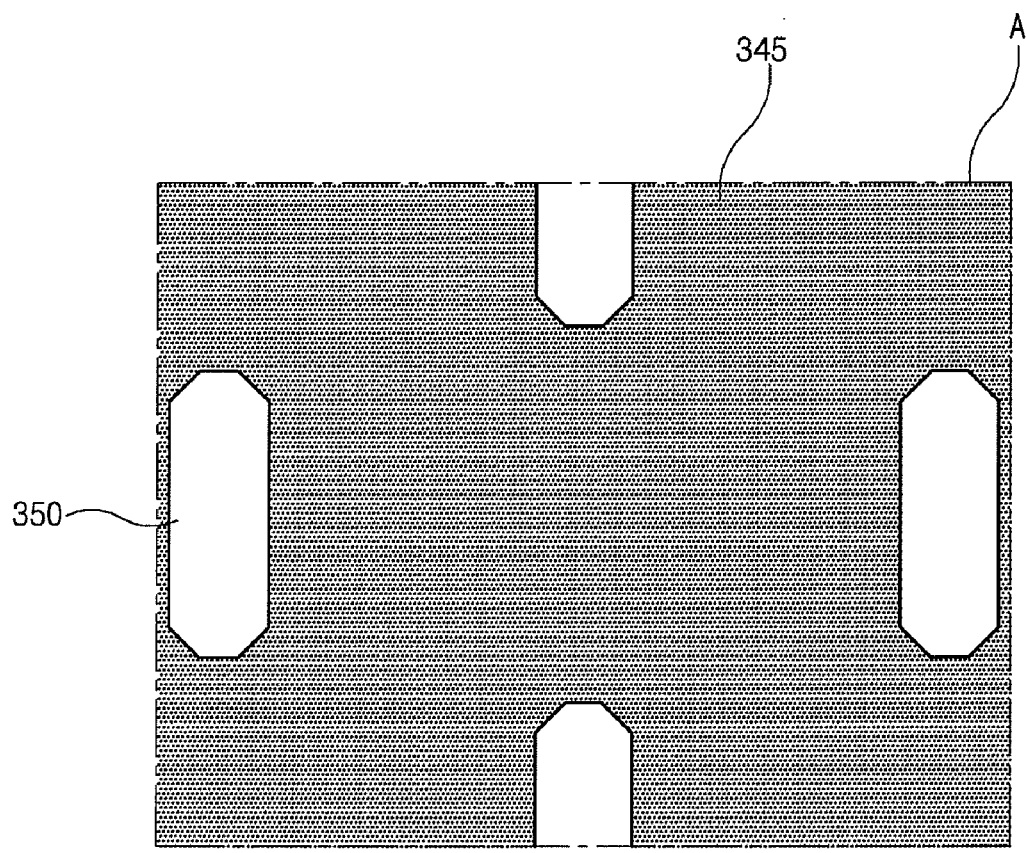
FIG. 10B is a magnified view of a portion A of FIG. 10A.

FIG. 10A is a plan view showing a shadow mask for fabricating an organic electroluminescent display device according to a second embodiment of the present invention, and FIG. 10B is a magnified view of a portion A of FIG. 10A.

In FIGS. 10A and 10B, a shadow mask 300 used in a vacuum thermal evaporation method for forming each of first, second and third organic patterns 250a, 250b and 250c (of FIG. 8) includes a frame 320 of a metallic material and a plate 330 of a metallic material. The frame 320 has a rectangular ring shape, and the plate 330 is disposed on the frame 320. The plate 330 includes a patterning portion 335 and a first shielding portion 340 surrounding the patterning portion 335. The plate 330 corresponds to a mother substrate (not shown) including a plurality of unit cell regions each corresponding to an organic ELD device, and the patterning portion 335 corresponds to the unit cell region. The patterning portion 335 includes a plurality of open portions 350 and a second shielding portion 345. The plurality of open portions 350 are disposed in matrix. For example, when the plurality of open portions may be disposed in two rows along a first direction (a horizontal direction), the plurality of open portions 350 in one row may be shifted from the plurality of open portions 350 in the other row along a diagonal direction with respect to the first and second directions (horizontal and vertical directions).

Each of the plurality of open portions 350 may have a rectangular shape having four truncated corners and may correspond to the two organic patterns corresponding to the same color of the two adjacent sub-pixel regions along the second direction. Although not shown, each open portion of a shadow mask for organic patterns of the organic ELD device according to a first embodiment may have a rectangular shape to correspond to the two organic patterns. For example, the shadow mask is aligned, and the first organic patterns 250a (of FIG. 9) of the first and seventh sub-pixel regions SP1 and SP7 may be formed by depositing a first organic material through the single open portion 350 of the shadow mask 300. The deposited first organic material may be divided into the first organic patterns 250a due to a separator formed on a first substrate of the organic ELD device. After the first organic patterns 250a is formed, the shadow mask 300 is re-aligned and the second organic patterns 250b (of FIG. 9) of the fifth and eleventh sub-pixel regions SP5 and SP11 may be formed by depositing a second organic material through the single open portion 350 of the shadow mask 300. Similarly, the shadow mask 300 is re-aligned and the third organic patterns 250c (of FIG. 9) of the third and ninth sub-pixel regions SP3 and SP9 may be formed by depositing a third organic material through the single open portion 350 of the shadow mask 300. Accordingly, a limitation in fabrication resolution of the shadow mask 300 is overcome and fabrication yield for the organic ELD device is improved.

The patterning portion 335 may have an area within a range of about 1 cm$^2$ to about 1000 cm$^2$, and the first shielding portion 340 may have a width within a range of about 1 mm to about 10 mm. Specifically, each of the plurality of open portions 350 and the second shielding portion 345 may have a width or a length within a range of about 10 μm to about 1000 μm. Since the shadow mask 300 is formed of a metallic material, the shadow mask 300 may expand due to heat to cause deformation such as warpage while the first, second and third organic patterns 250a, 250b and 250c are formed through a vacuum thermal evaporation method. Since the deformation of the shadow mask 300 causes a shadowing effect, the shadow mask 300 is formed to have a sufficient hardness to prevent the deformation. As a result, the fabrication resolution of the plurality of open portions 350 and the second shielding portion 345 of the shadow mask 300 have a limitation on formation of fine pattern, and the size and the number of the plurality of open portions 350 also have a limitation.

In a method of fabricating the organic ELD device according to the present invention, since the two organic patterns corresponding to the same color of the two adjacent sub-pixel regions along the second direction are formed by depositing an organic material through the single open portion 350 of the shadow mask 300, the number of the plurality of open portions 350 of the shadow mask 300 may increase. As a result, the limitation in fabrication resolution of the shadow mask 300 is overcome and production yield of the organic ELD device is improved.

Moreover, first, second and third organic patterns may be formed to have different areas based on an emission efficiency of each organic pattern in another embodiment. For example, the organic pattern having a higher emission efficiency may have an area greater than the organic pattern having a lower emission efficiency. When the first, second and third organic patterns 250a, 250b and 250c emit red, green and blue colored lights, respectively, the emission efficiency of the first organic pattern 250a may be greater than the emission efficiency of the third organic pattern 250c and may be smaller than the emission efficiency of the second organic pattern 250b. Accordingly, the area of the first organic pattern 250a may be greater than the area of the second organic pattern 250b and may be smaller than the area of the third organic pattern 250c so that the lights emitted from the first, second and third organic patterns 250a, 250b and 250c can have the same brightness as each other. As a result, stains caused by the second organic pattern 250b having the highest emission efficiency is reduced, and the uniformity in brightness and the controllability of white balance are improved.

Consequently, in the organic ELD device according to the present invention, since the organic patterns are disposed to have a zigzag shape along the first direction and the two adjacent organic patterns are spaced apart from each other by the predetermined distance for preventing a shadowing effect along the diagonal direction, each organic pattern has an enlarged area. Accordingly, an aperture ratio of the organic ELD is improved with obtaining the first distance d1 and preventing the shadowing effect.

In addition, since the aperture ratio is improved, the organic ELD device may be formed such that the pixel region has a reduced area. Accordingly, the number of pixel regions in a unit area may increase by reducing the area of the pixel region, and a resolution of the organic ELD device is improved.

Further, since the two organic patterns corresponding to the same color of the two adjacent sub-pixel regions along the second direction are formed by depositing an organic material through the single open portion of the shadow mask, the number of the open portions of the shadow mask increases. Accordingly, the limitation in fabrication resolution of the shadow mask is overcome and the production yield of the organic ELD device is improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent display device, comprising:
   first and second substrates facing and spaced apart from each other, the first and second substrates including at least one pixel region having first, second and third sub-pixel region;
   a gate line and a data line on the first substrate, the gate line and the data line crossing each other to define the at least one pixel region;
   a first electrode on the first substrate in each of the first, second and third sub-pixel regions;
   first, second and third organic patterns on the first electrode in the first, second and third sub-pixel regions, respectively, the first, second and third sub-pixel regions disposed in a single row along a first direction parallel to the gate line, the first, second and third organic patterns having a zigzag shape along the first direction with respect to a virtual line passing through a central portion of each of the first, second and third sub-pixel regions; and
   a second electrode on the first, second and third organic patterns;
   wherein the virtual line divides each of the first, second and third sub-pixel regions into an upper half portion and a lower half portion, and
   wherein the first organic pattern is disposed in either the lower half portion or the upper half portion of the first sub-pixel region and is not disposed in the other half portion of the first sub-pixel region,
   wherein the second organic pattern is disposed in the opposite half portion of the second sub-pixel region, opposite to that half portion of the first sub-pixel region in which the first organic pattern is disposed, and is not disposed in the other half portion of the second sub-pixel region, and
   wherein the third organic pattern is disposed in the same half portion of the third sub-pixel region as that half portion of the first sub-pixel region in which the first organic pattern is disposed, and is not disposed in the other half portion of the third sub-pixel region.

2. The device according to claim 1, wherein the first and second organic patterns are spaced apart from each other by a distance for preventing a shadowing effect along a diagonal direction with respect to the first direction and a second direction perpendicular to the first direction, and the second and third organic patterns are spaced apart from each other by the distance for preventing the shadowing effect along the diagonal direction with respect to the first direction and the second direction.

3. The device according to claim 1, wherein the first, second and third organic patterns correspond to red, green and blue organic patterns, respectively.

4. The device according to claim 3, wherein the first, second and third organic patterns are alternately disposed along the first direction and each of the first, second and third organic patterns is straightly disposed along a second direction parallel to the data line.

5. The device according to claim 1, wherein the virtual line divides each of the first, second and third sub-pixel regions into an upper half portion and a lower half portion, and wherein the first organic pattern is disposed in the lower half portion of the first sub-pixel region, the second organic pattern is disposed in the upper half portion of the second sub-pixel region, and the third organic pattern is disposed in the lower half portion of the third sub-pixel region.

6. The device according to claim 1, wherein the at least one pixel region includes first, second, third and fourth pixel regions in 2.times.2 matrix, wherein the first pixel region includes the first, second and third sub-pixel regions, the second pixel region includes fourth, fifth and sixth sub-pixel regions, the third pixel region includes seventh, eighth and ninth sub-pixel regions, and the fourth pixel region includes tenth, eleventh and twelfth sub-pixel regions, wherein the first organic pattern is disposed in each of the first, fourth, seventh and tenth sub-pixel regions, the second organic pattern is disposed in each of the second, fifth, eighth and eleventh sub-pixel regions, and the third organic pattern is disposed in each of the third, sixth, ninth and twelfth sub-pixel regions, and wherein the first, second and third organic patterns of the first and second pixel regions have the zigzag shape along the first direction with respect to the virtual line and the first, second and third organic patterns of the third and fourth pixel regions have the zigzag shape along the first direction with respect to the virtual line.

7. The device according to claim 6, wherein the virtual line divides each of the first to twelfth sub-pixel regions into an upper half portion and a lower half portion, wherein the first organic pattern is disposed in each of the lower half portion of the first sub-pixel region, the upper half portion of the fourth sub-pixel region, the upper half portion of the seventh sub-pixel region and the lower half portion of the tenth sub-pixel region, wherein the second organic pattern is disposed in each of the upper half portion of the second sub-pixel region, the lower half portion of the fifth sub-pixel region, the lower half portion of the eighth sub-pixel region and the upper half portion of the eleventh sub-pixel region, and wherein the third organic pattern is disposed in each of the lower half portion of the third sub-pixel region, the upper half portion of the sixth sub-pixel region, the upper half portion of the ninth sub-pixel region and the lower portion of the twelfth sub-pixel region.

8. The device according to claim 1, wherein each of the first, second and third organic patterns has one of a rectangular shape and a rectangular shape having two truncated corners.

9. The device according to claim 1, wherein the virtual line is parallel to the first direction and the gate line.

10. The device according to claim 1, further comprising:
a switching thin film transistor connected to the gate line and the data line;
a storage capacitor connected to the switching thin film transistor;
a power line connected to the storage capacitor; and
a driving thin film transistor connected to the switching thin film transistor and the power line.

11. A method of fabricating an organic electroluminescent display device, comprising:
forming a gate line and a data line on a first substrate, the gate line and the data line crossing each other to define at least one pixel region having first, second and third sub-pixel region;
forming a first electrode on the first substrate in each of the first, second and third sub-pixel regions;
forming first, second and third organic patterns on the first electrode in the first, second and third sub-pixel regions, respectively, using a shadow mask, the first, second and third sub-pixel regions disposed in a single row along a first direction parallel to the gate line, the first, second and third organic patterns having a zigzag shape along the first direction with respect to a virtual line passing through a central portion of each of the first, second and third sub-pixel regions;
forming a second electrode on the first, second and third organic patterns; and
attaching a second substrate to the first substrate with a seal pattern;
wherein the virtual line divides each of the first, second and third sub-pixel regions into an upper half portion and a lower half portion, and
wherein the first organic pattern is disposed in either the lower half portion or the upper half portion of the first sub-pixel region and is not disposed in the other half portion of the first sub-pixel region,
wherein the second organic pattern is disposed in the opposite half portion of the second sub-pixel region, opposite to that half portion of the first sub-pixel region in which the first organic pattern is disposed, and is not disposed in the other half portion of the second sub-pixel region, and
wherein the third organic pattern is disposed in the same half portion of the third sub-pixel region as that half portion of the first sub-pixel region in which the first organic pattern is disposed, and is not disposed in the other half portion of the third sub-pixel region.

12. The method according to claim 11, wherein the shadow mask includes a plurality of open portions in matrix.

13. The method according to claim 12, wherein adjacent two of the first, second and third organic patterns along the second direction are formed by depositing an organic material through a single one of the plurality of open portions.

14. The method according to claim 13, wherein each of the plurality of open portions has one of a rectangular shape and a rectangular shape having four truncated corners.

15. An organic electroluminescent display device, comprising:
first and second substrates facing and spaced apart from each other, the first and second substrates including at least one pixel region having first, second and third sub-pixel region;
a gate line and a data line on the first substrate, the gate line and the data line crossing each other to define the at least one pixel region;
a first electrode on the first substrate in each of the first, second and third sub-pixel regions;
first, second and third organic patterns on the first electrode in the first, second and third sub-pixel regions, respectively, the first, second and third organic patterns having a zigzag shape along a first direction parallel to the gate line with respect to a virtual line passing through a central portion of each of the first, second and third sub-pixel regions and dividing each of the first, second and third sub-pixel regions into an upper half portion and a lower half portion; and
a second electrode on the first, second and third organic patterns;
wherein the first organic pattern is disposed in either the lower half portion or the upper half portion of the first sub-pixel region and is not disposed in the other half portion of the first sub-pixel region,
wherein the second organic pattern is disposed in the opposite half portion of the second sub-pixel region, opposite to that half portion of the first sub-pixel region in which the first organic pattern is disposed, and is not disposed in the other half portion of the second sub-pixel region, and
wherein the third organic pattern is disposed in the same half portion of the third sub-pixel region as that half portion of the first sub-pixel region in which the first organic pattern is disposed, and is not disposed in the other half portion of the third sub-pixel region.

16. An organic electroluminescent display device, comprising:
first and second substrates facing and spaced apart from each other, the first and second substrates including at least one pixel region having first, second and third sub-pixel region;
a gate line and a data line on the first substrate, the gate line and the data line crossing each other to define the at least one pixel region;
a first electrode on the first substrate in each of the first, second and third sub-pixel regions;
first, second and third organic patterns on the first electrode in the first, second and third sub-pixel regions, respectively, the first, second and third organic patterns having a zigzag shape along a first direction parallel to the gate line with respect to a virtual line passing through a central portion of each of the first, second and third sub-pixel region; and
a second electrode on the first, second and third organic patterns,
wherein the virtual line divides each of the first, second and third sub-pixel regions into an upper half portion and a lower half portion,
wherein the first organic pattern is disposed in the lower half portion of the first sub-pixel region and is not disposed in the upper half portion of the first sub-pixel region, wherein the second organic pattern is disposed in the upper half portion of the second sub-pixel region and is not disposed in the lower half portion of the second sub-pixel region, and wherein the third organic pattern is disposed in the lower half portion of the third sub-pixel region and is not disposed in the upper half portion of the third sub-pixel region.

17. A method of fabricating an organic electroluminescent display device, comprising:

forming a gate line and a data line on a first substrate, the gate line and the data line crossing each other to define at least one pixel region having first, second and third sub-pixel region;

forming a first electrode on the first substrate in each of the first, second and third sub-pixel regions;

forming first, second and third organic patterns on the first electrode in the first, second and third sub-pixel regions, respectively, using a shadow mask, the first, second and third organic patterns having a zigzag shape along a first direction parallel to the gate line with respect to a virtual line passing through a central portion of each of the first, second and third sub-pixel regions and dividing each of the first, second and third sub-pixel regions into an upper half portion and a lower half portion;

forming a second electrode on the first, second and third organic patterns; and attaching a second substrate to the first substrate with a seal pattern;

wherein the first organic pattern is disposed in either the lower half portion or the upper half portion of the first sub-pixel region and is not disposed in the other half portion of the first sub-pixel region, wherein the second organic pattern is disposed in the opposite half portion of the second sub-pixel region, opposite to that half portion of the first sub-pixel region in which the first organic pattern is disposed, and is not disposed in the other half portion of the second sub-pixel region, and wherein the third organic pattern is disposed in the same half portion of the third sub-pixel region as that half portion of the first sub-pixel region in which the first organic pattern is disposed, and is not disposed in the other half portion of the third sub-pixel region.

18. A method of fabricating an organic electroluminescent display device, comprising:

forming a gate line and a data line on a first substrate, the gate line and the data line crossing each other to define at least one pixel region having first, second and third sub-pixel region;

forming a first electrode on the first substrate in each of the first, second and third sub-pixel regions;

forming first, second and third organic patterns on the first electrode in the first, second and third sub-pixel regions, respectively, using a shadow mask, the first, second and third organic patterns having a zigzag shape along a first direction parallel to the gate line with respect to a virtual line passing through a central portion of each of the first, second and third sub-pixel regions;

forming a second electrode on the first, second and third organic patterns; and attaching a second substrate to the first substrate with a seal pattern, wherein the virtual line divides each of the first, second and third sub-pixel regions into an upper half portion and a lower half portion, wherein the first organic pattern is disposed in either the lower half portion or the upper half portion of the first sub-pixel region and is not disposed in the other half portion of the first sub-pixel region, wherein the second organic pattern is disposed in the opposite half portion of the second sub-pixel region, opposite to that half portion of the first sub-pixel region in which the first organic pattern is disposed, and is not disposed in the other half portion of the second sub-pixel region, and wherein the third organic pattern is disposed in the same half portion of the third sub-pixel region as that half portion of the first sub-pixel region in which the first organic pattern is disposed, and is not disposed in the other half portion of the third sub-pixel region.

* * * * *